United States Patent
Perrone

(10) Patent No.: US 11,332,036 B2
(45) Date of Patent: May 17, 2022

(54) ESTIMATION METHOD OF THE RESIDUAL RANGE OF AN ELECTRIC VEHICLE

(71) Applicant: IVECO S.p.A., Turin (IT)

(72) Inventor: Attilio Perrone, Sant'Olcese (IT)

(73) Assignee: IVECO S.P.A., Turin (IT)

( * ) Notice: Subject to any disclaimer, the term of this patent is extended or adjusted under 35 U.S.C. 154(b) by 384 days.

(21) Appl. No.: 16/424,217

(22) Filed: May 28, 2019

(65) Prior Publication Data

US 2019/0366870 A1  Dec. 5, 2019

(30) Foreign Application Priority Data

May 30, 2018  (IT) .................. 102018000005878

(51) Int. Cl.
*B60L 58/12* (2019.01)
*G01R 31/367* (2019.01)
*G01R 31/382* (2019.01)
*B60L 50/50* (2019.01)

(52) U.S. Cl.
CPC ........... *B60L 58/12* (2019.02); *G01R 31/367* (2019.01); *G01R 31/382* (2019.01); *B60L 50/50* (2019.02); *B60L 2240/547* (2013.01)

(58) Field of Classification Search
CPC ........ G07C 5/08; H01M 6/00; H01M 6/5088; H01M 10/63; H01M 10/633; B60L 11/00; B60L 11/18; B60L 50/00; B60L 50/50; B60L 2240/00; B60L 2240/547; B60L 58/00; B60L 58/10; B60L 58/12; B60L 58/13; B60L 58/14; B60L 58/15; B60L 58/16; B60L 58/18; G01R 31/00; G01R 31/367; G01R 31/382; G01R 31/385
USPC ........................................................ 701/34.2
See application file for complete search history.

(56) References Cited

U.S. PATENT DOCUMENTS 7,492,126 B2 *  2/2009  Hogari ............... G01R 31/3842
                                                320/132

FOREIGN PATENT DOCUMENTS

| DE | 102012216617 A1 | 5/2013 |
| EP | 3069923 A1 | 9/2016 |
| GB | 2505665 A | 3/2014 |
| WO | WO2013026973 A1 | 2/2013 |

OTHER PUBLICATIONS

Italian Search Report for Application No. IT 201800005878, dated Feb. 6, 2019, 8 pages.

* cited by examiner

*Primary Examiner* — Anthony R Jimenez
(74) *Attorney, Agent, or Firm* — McCracken & Gillen LLC

(57) ABSTRACT

An estimation method of the residual charge of an electric vehicle comprising at least one electric battery and at least one motor configured to use, at least in part, the energy of said at least one battery for enabling the operation of the electric vehicle, the method comprising a plurality of calculation steps for calculating an optimised coefficient of available energy that takes into account the actual operation of the vehicle in order to correct the energy of said batteries at the beginning of the next work cycle.

7 Claims, 1 Drawing Sheet

ESTIMATION METHOD OF THE RESIDUAL RANGE OF AN ELECTRIC VEHICLE

CROSS-REFERENCE TO RELATED APPLICATIONS

This Patent Application claims priority from Italian Patent Application No. 102018000005878 filed on May 30, 2018, the entire disclosure of which is incorporated herein by reference.

STATEMENT RE: FEDERALLY SPONSORED RESEARCH/DEVELOPMENT

Not Applicable

TECHNICAL FIELD

The present invention relates to a method for estimating the residual range of a vehicle, more specifically the residual range of an electric vehicle.

Electric vehicles require an estimate of the residual range, i.e. for how long the batteries have sufficient energy to allow the vehicle to travel.

KNOWN PRIOR ART

This range is often calculated according to the state of charge or SOC, a parameter that expresses the residual charge of the batteries in percentage, from which, multiplying such parameter by the nominal capacity of the batteries, it is possible to trace the residual charge of the same.

However, it is known that such parameter is extremely inaccurate as it is obtained by means of devices for monitoring the voltage of vehicle batteries, which are not very sensitive and reliable.

For this purpose, a corrective parameter provided by the battery manufacturers is generally used, which is configured to correct the above-mentioned SOC value. Normally this value is tabulated and is calculated on an hourly basis. However, as the SOC estimate is inaccurate, despite the multiplication by the corrective factor such estimate still remains inaccurate.

EP3069923 A1 illustrates an alternative method for a precise estimation of the residual range of electric vehicles using a tabulated corrective value based on a discharge time of vehicle batteries that can be empirically acquired on the basis of tests of standard vehicle missions.

However, even the above-mentioned estimate is not sufficiently accurate because it is clear that the values obtained empirically, calculated on the basis of tests of standard missions, will never correspond to the actual use values of the vehicle.

In fact, it is known that during such tests of standard missions the consumptions due to some electrical devices, for example the conditioning devices of the vehicle, are not counted. It is therefore clear that these tests do not faithfully reflect the battery consumptions during normal use of an electric vehicle.

Therefore, there is a need to improve the methods for estimating the residual range of known electric vehicles.

The purpose of the present invention is to solve the technical problem described above.

SUMMARY OF THE INVENTION

The above purpose is achieved with a method as claimed in the appended claims.

BRIEF DESCRIPTION OF THE DRAWINGS

In order to better understand the present invention, a non-limiting preferred embodiment thereof will now be described by way of example with reference to the accompanying drawings, in which.

DETAILED DESCRIPTION OF THE INVENTION

The present method may be applied to a vehicle (not illustrated), preferably an electric vehicle, essentially comprising at least one battery configured to power, at least partially, at least one electric motor cooperating with a drive system to ensure the running of the vehicle and configured to power the different devices in a vehicle.

Figure 1:
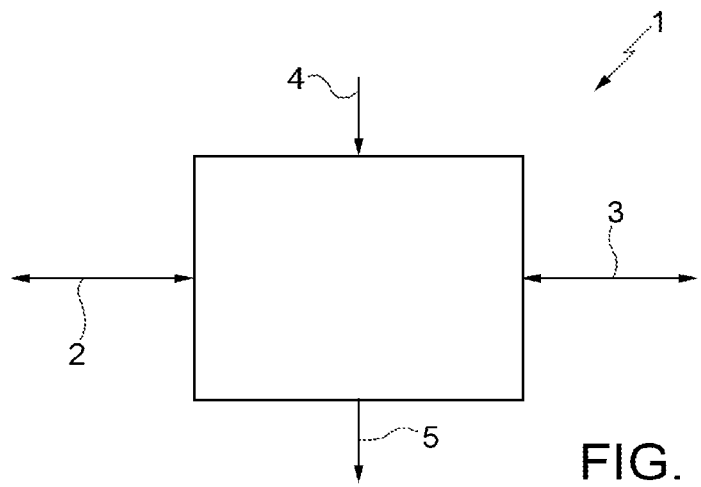
FIG. 1 schematically illustrates a management unit for an electric vehicle.

FIG. 1 schematically illustrates a vehicle management unit 1, or VMU ("Vehicle management unit") connected to respective CAN BUS 2 of traction control, e.g., the motor, the drive system, and CAN BUS 3 of braking and electric traction chain management systems e.g., traction batteries or inverter.

The management unit 1 can also receive input signals 4 from the vehicle via the abovementioned CAN BUS 2 and 3, and can obviously send output signals 5 to the vehicle, for example to a graphical interface for the vehicle user (HMI). Of course, the management unit 1 is equipped with an internal memory, such as an EEPROM.

From the CAN BUS 2, 3 the management unit 1 receives a plurality of parameters such as, for example:

vehicle speed V in km/h;
the distance X travelled by the vehicle in km;
a threshold distance $X_s$, of a pre-set value in km;
the available energy E of the batteries in kWh;
the depth of discharge DOD, a dimensionless value indicating the unavailable amount of energy;
the state of charge SOC, equal to the complementary of DOD, i.e. SOC=100%−DOD;
the time T elapsed since the vehicle was in motion, e.g. in h;
the maximum and minimum threshold of the battery state of charge $S_{max}$, $S_{min}$, as dimensionless coefficients, for example configurable at 17% and 83%.

From the internal memory, the management unit 1 can take the dimensionless values of an available energy coefficient $K_{ae}$ tabulated as a function of time. These values can be stored as follows:

| Calculated discharge time [h] | Coefficient Kae |
|---|---|
| 1 | 0.78 |
| 2 | 0.89 |
| 3 | 0.92 |
| 4 | 0.94 |
| 5 | 0.95 |
| 8 | 0.97 |

Figure 2:
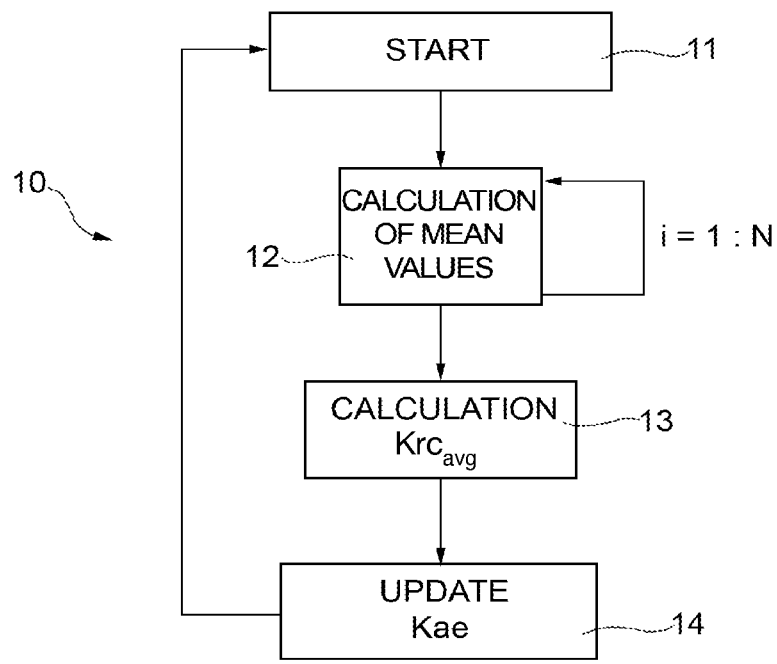
FIG. 2 is a block diagram that schematically describes the method of the present invention.

The management unit 1 comprises electronic processing means configured to acquire and store the above-mentioned values and advantageously to elaborate an iterative method, described in detail below, for estimating the residual range of a vehicle and schematized in block diagram 10 of FIG. 2.

The method of estimating the residual range of an electric vehicle according to the present invention essentially comprises the following steps:

a first initialization step 11, at the beginning of the calculation cycle, for calculating the initial values of essential parameters for the following steps, such as the real energy $E_r$ and the state of charge SOC of the vehicle batteries using the data acquired and/or already stored by management unit 1;

a second calculation step of mean values 12, as an average of values calculated for successive iterations at a pre-set running interval travelled by the vehicle, such as the average usable energy $E_{uavg}$ of the batteries and the average speed $V_{avg}$ of the vehicle;

a third step 13 in which a current available energy coefficient $Krc_{avg}$ characteristic of the working conditions of the vehicle is calculated;

a fourth step 14 in which the distance and the residual discharge time of the electric batteries are calculated and a new value of $K_{ae}$ is selected, according to such residual discharge time, to reinitialize the estimation method from the first step 11 mentioned above.

In particular, the initialisation step 11 comprises the steps of:

calculating the real energy $E_r$ multiplying the available energy E measured by the vehicle's batteries by an available energy coefficient $K_{ae}$, selected according to tabulated measures (for the first work cycle ever it can be selected in a pre-set way, for example the mean value of all the tabulated ones), as in the table described above.

$$E_r = E * K_{ae}$$

calculating the usable state of charge $Soc_{us}$ through the equation:

$$Soc_{us} = [100\% - avg(DOD) - S_{min}] * (100 S \max)$$

Where $Soc_{us}$ is calculated as a complement to the average DOD on the vehicle batteries and multiplied by a safety factor as a function of $S_{min}$ and $S_{max}$, for example assuming $S_{min} = 17\%$ as a safety margin.

The second calculation step 12 of mean values essentially comprises the steps of:

calculating the usable energy $E_u(i)$ at the i-th moment as:

$$E_{u(i)} = E_r * Soc_{us} * 0.01$$

measuring the vehicle's speed V(i) and distance X(i) at the i-th moment;

storing the i-th value of $E_u(i)$ and V(i), where said i-th value is sampled at a pre-set time interval provided that the distance X(i) travelled in such interval of time is greater than a threshold distance $X_s$. The value of such distance $X_s$ can be varied at will depending on the distance for which the sampling is deemed necessary, for example every kilometre.

This calculation is iterated as many times as one wishes to sample the measurement of $E_u$, X and V, for example i=1:5.

The second step also comprises calculating an average usable energy of the batteries $Eu_{avg}$, an average distance $X_{avg}$, an average speed of the vehicle $V_{avg}$, as respective averages, for example arithmetic averages, of the i-th values previously calculated.

The third step 13 comprises calculating a parameter of a current available energy coefficient $Krc_{avg}$ as:

$$Krc_{avg} = X_{avg} / E_{avg}$$

where $E_{avg}$ and $X_{avg}$ are respectively the average energy and the average distance previously calculated.

The fourth step 14 comprises calculating the residual kilometers, $Range_{km}$, which can be covered with the available energy of the batteries, and the residual time range, $Time_{range}$, as a function of the current available energy coefficient $Krc_{avg}$.

In particular, these values can be calculated using the equations:

$$Range_{km} = E_r * Krc_{avg}$$

and $$Time_{range} = Range_{km} / V_{avg}$$

The above-mentioned values are sent to an HMI interface of the vehicle, such as a display, to allow the user of the electric vehicle to view them.

At this point it is possible to update the value of the available energy coefficient $K_{ae}$, used during the first step 11, using the value of $K_{ae}$ related to the time calculated above.

If there is no tabulated value for the calculated time, this value can be advantageously obtained from the values already present by interpolation of a known type, such as linear or polynomial interpolation.

The calculation cycle can be repeated at regular time intervals or after travelling a pre-set distance, or continuously.

At the end of each calculation cycle, the values of $Krc_{avg}$ are advantageously stored for the purposes listed below.

In the following, the term 'work cycle' means the operation of the vehicle from one ignition to the next switching off.

Therefore, at the end of such work cycle the unit will store the values mentioned above and, advantageously, the values of $Krc_{avg}$ are averaged against each other to obtain a value of the overall available energy coefficient $Krc_{abs}$ equal to the average of the values of all the $Krc_{avg}$ of the calculation cycles of the vehicle work cycle.

At the next first work cycle with respect to the calculation of $Krc_{abs}$ the third step 13 may comprise a further correction step in which the current available energy coefficient $Krc_{avg}$ is further refined by calculating an adjusted coefficient of available energy $Krc_{avg}$, as an average between $Krc_{avg}$ and $Krc_{abs}$. In this way, previous work cycles can be taken into account and the measurement of the available energy coefficient can be increasingly refined.

In this way, the estimate of $K_{ae}$ used to calculate the real energy $E_r$ at the beginning of the work cycle will be more and more accurate and refined since it is based on an increasing number of real work cycles of the vehicle.

The advantages of the method of the invention for estimating the residual range of the vehicle are apparent from the above description.

Thanks to the method described above, it is possible to calculate precisely the value of the residual range of an electric vehicle. In particular, it is possible to select an available energy coefficient $K_{ae}$ no longer based on experimental tests but on a real time calculated on the basis of a multitude of real work cycles, including habitual situations of use of the vehicle.

In fact, electrical loads which are normally not considered during bench tests, are also calculated in these work cycles, further refining the $K_{ae}$ estimate.

In addition, work cycle after work cycle, it is possible to increasingly refine the calculation of the Krc coefficient.

Finally, it is clear that the method of estimating the residual range of the vehicle implemented according to the present invention can be modified and variations can be made without departing from the scope of the present invention, as set forth in the claims.

For example, the averages of the aforementioned values could be calculated differently or additional intermediate calculation steps could be included within a step of the method as claimed.

What is claimed is:

1. An estimation method of a residual range of an electric vehicle comprising at least one battery and at least one motor configured to use, at least in part, an output of said at least one battery for enabling movement of said electric vehicle, said method comprising:

a first initialisation step (11) wherein a real energy ($E_r$) and a state of charge (SOC) of said at least one battery are calculated, said state of charge (SOC) of said at least one battery of the vehicle being calculated using the equation:

$$Soc_{us}=[100\%-avg(DOD)-S_{min}]*(100/S_{max})$$

where avg(DOD) is an average DOD on the at least one battery of the vehicle, said DOD is a measured depth of discharge of the battery, defined as 100% minus a measured state of charge of the battery, and where $S_{min}$, $S_{max}$ represent respectively a minimum and a maximum threshold value of the state of charge of the at least one battery, and said real energy ($E_r$) being defined and calculated through the further equation:

$$E_r=E*K_{ae}$$

where E is the measured available energy of said at least one battery, and $K_{ae}$ is a dimensionless corrective coefficient for correcting said available energy based on experimental tests and previously stored as a function of a discharge time of said at least one battery, a second calculation step (12) of an average usable energy value ($Eu_{avg}$) of said at least one battery and of an average distance travelled ($X_{avg}$) by said vehicle as averages of respective values sampled at predetermined intervals at an i-th time, said usable energy ($E_{u(i)}$) being defined and calculated through the equation:

$$E_{u(i)}=E_{r(i)})*Soc_{us(i)})*0,01$$

where $E_{u(i)}$ defines said usable energy at the i-th time, $Soc_{us(i)}$ is $Soc_{us}$ calculated at the i-th time, and $E_{r(i)}$ is $E_r$ calculated at the i-th time, a third step (13) wherein for each sampling, a current available energy coefficient is calculated as and defined through the equation:

$$Krc_{avg}=X_{avg}/Eu_{avg}$$

where $Krc_{avg}$ defines said current available energy coefficient, a fourth step (14) wherein the residual range is estimated as residual kilometers and/or residual operating time of the vehicle as a function of said current available energy coefficient ($Krc_{avg}$).

2. The method according to claim 1, in which said current available energy coefficient ($Krc_{avg}$) is stored at each calculation cycle in said third step (13), said stored values being averaged at the end of a work cycle of said vehicle to derive an overall coefficient of available energy ($Krc_{abs}$), said overall coefficient of available energy ($Krc_{abs}$) being used to correct the current available energy coefficient ($Krc_{avg}$) calculated in the first work cycle following the calculation of said overall coefficient of available energy ($Krc_{abs}$) before the calculation of said kilometers and said residual range in said fourth step, said correction being made by averaging the value of said overall coefficient of available energy ($Krc_{abs}$) and said current available energy coefficient ($Krc_{avg}$).

3. An electric vehicle comprising at least one motor configured to use, at least in part, the output of said at least one battery, the electric vehicle comprising a management unit comprising electronic means configured to acquire, process and store operating values of said vehicle and to process the method steps according to claim 1.

4. The method according to claim 1, in which said method is cyclically repeated at intervals of time and/or distance travelled by said vehicle which are pre-set over a whole work cycle of said vehicle.

5. The method according to claim 1, in which said corrective coefficient tabulated as a function of time and is pre-set for a first work cycle ever of said vehicle.

6. The method according to claim 1, in which said residual kilometers and/or residual operating time of the vehicle are calculated by means of the equations:

$$Range_{km}=E_r*Krc_{avg}$$

$$Time_{range}=Range_{km}/V_{avg}$$

where $V_{avg}$ is an average velocity of said vehicle as an average of respective velocity values sampled at predetermined intervals at an i-th time.

7. The method according to claim 6, in which said corrective coefficient is equal to the mean value of all the tabulated values for a first work cycle ever of said vehicle.

* * * * *